United States Patent
Muhtaroglu

(10) Patent No.: US 7,036,061 B2
(45) Date of Patent: Apr. 25, 2006

(54) STRUCTURAL INPUT LEVELS TESTING USING ON-DIE LEVELS GENERATORS

(75) Inventor: Ali Muhtaroglu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 428 days.

(21) Appl. No.: 09/941,484

(22) Filed: Aug. 28, 2001

(65) Prior Publication Data

US 2003/0046624 A1    Mar. 6, 2003

(51) Int. Cl.
*G01R 31/28* (2006.01)

(52) U.S. Cl. ...................... 714/727; 714/734

(58) Field of Classification Search ............... 714/819, 714/727, 736, 734, 733, 716, 30, 731, 738, 714/724, 721; 324/522, 523, 527, 426, 537, 324/763, 765, 76.83, 76.15; 341/94, 132, 341/155, 158, 55; 371/1
See application file for complete search history.

(56) References Cited

U.S. PATENT DOCUMENTS

| | | | | |
|---|---|---|---|---|
| 4,928,278 A | * | 5/1990 | Otsuji et al. ................. 714/700 |
| 5,231,314 A | * | 7/1993 | Andrews ...................... 327/153 |
| 5,600,247 A | * | 2/1997 | Matthews ..................... 324/426 |
| 6,085,345 A | * | 7/2000 | Taylor .......................... 714/731 |
| 6,310,571 B1 | * | 10/2001 | Yang et al. ................... 341/155 |
| 6,477,674 B1 | * | 11/2002 | Bates et al. ................... 714/738 |
| 6,492,798 B1 | * | 12/2002 | Sunter ....................... 324/76.15 |
| 6,629,274 B1 | * | 9/2003 | Tripp et al. .................. 714/721 |
| 2003/0005374 A1 | * | 1/2003 | Fought et al. ............... 714/724 |

* cited by examiner

*Primary Examiner*—Albert Decady
*Assistant Examiner*—John J. Tabone, Jr.
(74) *Attorney, Agent, or Firm*—Blakely, Sokoloff, Taylor & Zafman LLP

(57) ABSTRACT

A set of levels generating circuits, such as a set of digital-to-analog converters, is designed into an integrated circuit on-die. The levels generating circuits apply direct current (DC) voltage levels to on-die sense amplifiers to test sense amplifier trip points for "input low voltage" (VIL) and "input high voltage" (VIH). The levels generating circuits are controlled by a set of configuration bits, which may be accessible through the boundary-scan register or the input/output (I/O) loop back pattern generator. The levels generating circuitry allows testing of one number of integrated circuit input pins using a smaller number of input pins.

23 Claims, 4 Drawing Sheets

STRUCTURAL INPUT LEVELS TESTING USING ON-DIE LEVELS GENERATORS

BACKGROUND OF THE INVENTION

1. Field of the Invention

The present invention is related generally to component testing and, in particular to testing input levels on integrated circuits.

2. Background Information

When products are sold to original equipment manufacturers (OEMs) the products are usually accompanied by device specifications. The specifications typically include acceptable operating conditions, connection recommendations, direct current (DC) specifications, and alternating current (AC) specifications. The device is commonly warranted to perform according to the specifications.

Product manufacturers perform certain tests on the devices in order to guarantee the product complies with the specifications. For example, when the DC specifications state that the "input low voltage" (VIL) is three hundred millivolts at a minimum and eight hundred millivolts at a maximum, the manufacturer has tested the product to ensure that a DC voltage between three hundred millivolts and eight hundred millivolts applied to the part is interpreted as a logical "zero." Similarly, when the DC specifications state that the "input high voltage" (VIH) is two volts at a minimum and the supply voltage ($V_{CC}$) at a maximum, the manufacturer has tested the part to ensure that a DC voltage between two volts and Vcc applied to the part is interpreted as a logical "one."

Test paradigms are defined generally by the kind of test (functional or structural), and the kind of tester that delivers and stores the test (functional or structural) In general, structural testers have fewer direct connections to the device under test than functional testers, and depend on many DFT (Design For Testability) features designed into the device to perform equivalent tests to the functional testers. Because the design and silicon area costs are much lower than the tester costs, it may be advantageous for any product to utilize structural testers and DFT hooks to support them whenever possible.

Functional tests target device functionality and attempt to ensure that the device is functioning correctly. Functional tests are primarily performed for architectural verification and silicon debug, but can be used for manufacturing testing as well. A ITS9000 series tester from Schlumberger is an example of a well-known functional tester. An advantage of functional testers is that they commonly drive a large number of input/output (I/O) pins at high clock rates with great timing accuracy. When testing integrated circuits, for example, a functional tester allocates a tester channel to each pin of the device under test. Typically, in levels testing an input signal value is applied to the input pins of the part. The input signal value swings up and down between a logical "one" and a logical "zero," respectively, beyond an offset amount from a reference voltage. The product input circuitry (e.g., sense amplifier) trips in one direction for a logical "one" and in the other direction for a logical "zero."

Testing products, especially in high volumes typical of manufacturing environments using functional testers, requires huge capital investment over short time periods, however, because the testers quickly become obsolete. Moreover, functional tests are inefficient and cumbersome because they usually have to be manually written.

Structural tests screen for manufacturing defects and attempt to ensure the manufacturing correctness of basic devices (e.g. wiring, transistors, etc.). Structural testers perform structural tests using DFT channels. Teradyne, Inc., in Boston, Mass. offers structural testers. An advantage of structural testers is that their cost is considerably lower than the cost of functional testers. When testing integrated circuits, for example, a structural tester usually depends on the device itself to test its own input/output (I/O) specifications and report the pass/fail results to the tester through a limited number of connected pins. Timing defects for example are diagnosed through such a DFT feature called AC I/O loop-back that modulates its driver output (between a logical "one" and a logical "zero") through a within device pattern generator, and strobes it back through its sense amplifier at the input path for within device comparison logic.

This approach is limited, however, because current AC I/O loop-back based structural tests cannot screen marginal (VIH/VIL) levels defects since there are no DFT knobs to change the amplitude of the driven signal. Additionally, an output level defect can be hidden by an input level defect since the two are exercised together.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which.

DETAILED DESCRIPTION OF THE ILLUSTRATED EMBODIMENTS

Figure 1:
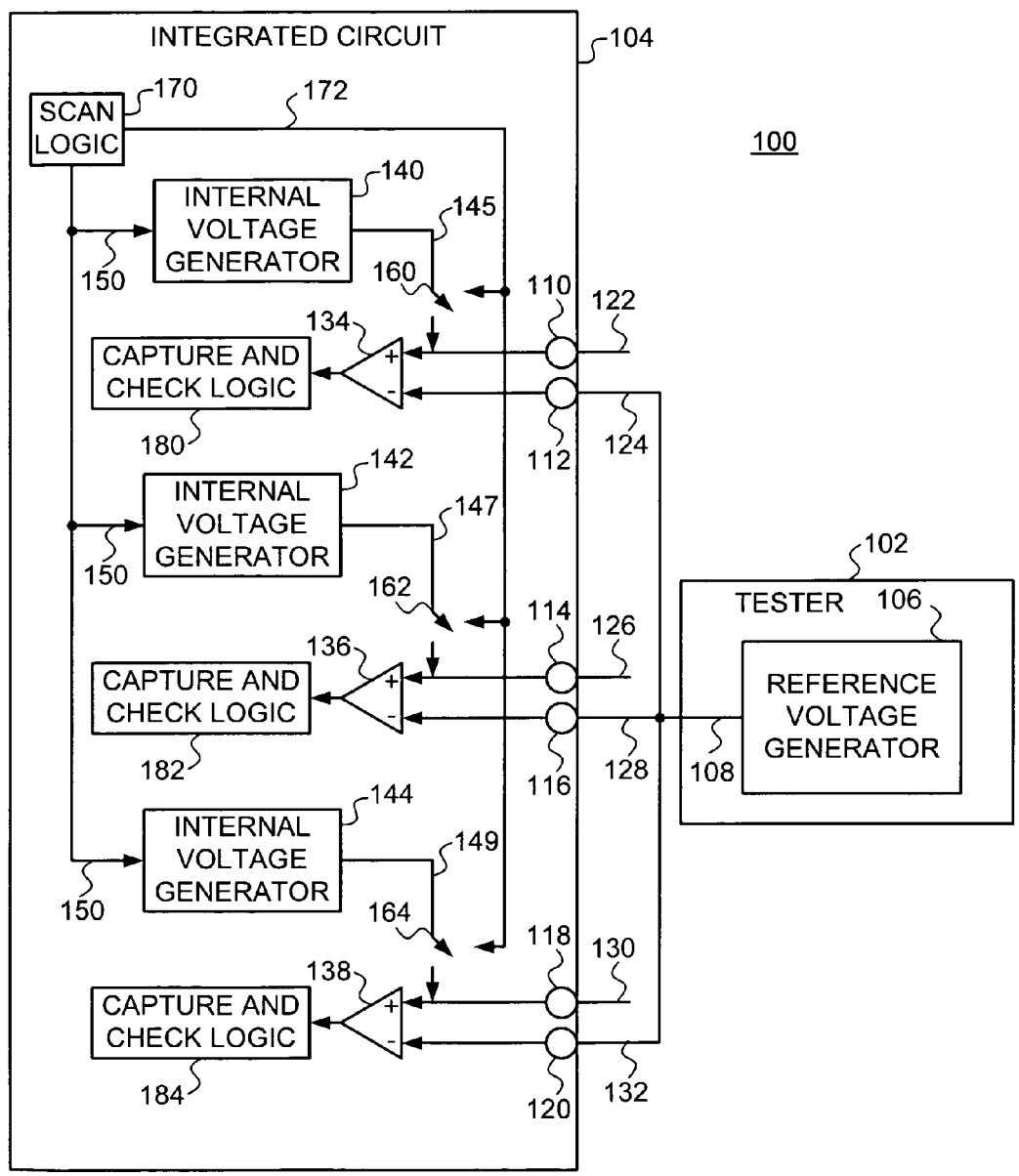
FIG. 1 is a high-level block diagram of an example test environment suitable for implementing embodiments of the present invention.

A system and corresponding methods to test integrated circuit input levels using an on-die levels generator are described in detail herein. In the following description, numerous specific details, such as particular processes, materials, devices, and so forth, are presented to provide a thorough understanding of embodiments of the invention. One skilled in the relevant art will recognize, however, that the invention can be practiced without one or more of the specific details or with other methods, components, etc. In other instances, well-known structures or operations are not shown or described in detail to avoid obscuring aspects of various embodiments of the invention.

Some parts of the description will be presented using terms such as digital-to-analog converter, processor, sense amplifier, receiver, comparator, logic, register, and so forth. These terms are commonly employed by those skilled in the art to convey the substance of their work to others skilled in the art.

Other parts of the description will be presented in terms of operations performed by a computer system, using terms such as receiving, detecting, collecting, transmitting, and so forth. As is well understood by those skilled in the art, these quantities and operations take the form of electrical, magnetic, or optical signals capable of being stored, transferred, combined, and otherwise manipulated through mechanical and electrical components of a computer system; and the term "computer system" includes general purpose as well as special purpose data processing machines, systems, and the like, that are standalone, adjunct or embedded.

Various operations will be described as multiple discrete actions performed in turn in a manner that is most helpful in understanding the invention. However, the order in which they are described should not be construed to imply that these operations are necessarily order dependent or that the operations be performed in the order in which the actions are presented.

Reference throughout this specification to "one embodiment" or "an embodiment" means that a particular feature, structure, process, action, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The present invention is directed to input levels testing of integrated circuits using on-die levels generators such that integrated circuits having a first number of input pins can be input levels tested concurrently (or in parallel) using a second smaller number of input pins. The integrated circuits under test may be microprocessors, microcontrollers, programmable logic displays (PLDs), configurable PLDs (CPLDs), field programmable gate arrays (FPGAs), application specific integrated circuits (ASICs), network integrated circuits, or any other discrete device. In one embodiment, the integrated circuits under test conform to the well-known Institute of Electrical and Electronics Engineers (IEEE) as IEEE Standard 1149.1, also referred to as the Joint Test Action Group (JTAG) Standard.

The IEEE 1149.1 or JTAG Standard specifies hardware and software that may be used to enable design for testability of integrated circuits. According to the JTAG Standard, a single cell of a shift-register (or JTAG circuitry) is designed into the integrated circuit logic and may be linked to one or more digital pin of the integrated circuit. This single cell links the JTAG circuitry to the integrated circuit's internal core logic. A group of cells on a particular integrated circuit is referred to as a register. The register logic becomes active when performing JTAG testing and remains passive under normal integrated circuit operation.

Also according to the JTAG Standard, the integrated circuit architecture for each JTAG compatible device has a test access port (TAP port). Typically, integrated circuits are manufactured and tested in large volumes. Prior to performing certain tests, several integrated circuits may be chained together via their respective TAP ports. Alternatively, multiple input pins on a single integrated circuit may be tested through the TAP port of the integrated circuit under test. When testing a single integrated circuits, data is scanned (shifted in serially) in through the integrated circuit's TAP port to fill up the integrated circuit's scan chain. When testing several integrated circuits in parallel, the TAP ports are accessed in parallel and data is scanned in through one TAP port to the next TAP port until all TAP scan chains are all filled. A command is run and data is shifted out in the same manner. For example, and as is well-known, the TAP port has four (or optionally five) pins, any one of which may be referred to as a "boundary pin" or a "test access pin." A test clock (TCK) pin receives a test clock signal for the device under test. A test mode select (TMS) pin accepts commands to select particular test modes. A test data in (TDI) pin accepts data into the device under test. A test data output (TDO) pin sends data out from the device under test.

FIG. 1 depicts an exemplar test environment 100 suitable for implementing embodiments of the present invention. The example test environment 100 includes a tester 102 and at least one integrated circuit 104, which may be a JTAG compatible device under test in one embodiment.

The example tester 102 may be any well-known, low-cost, off-the-shelf, single port structural tester, which connects the TAP ports of several integrated circuits in series in a chain and tests the TAP ports in parallel. An external pin (not shown) of the example integrated circuit 104 may be used to trigger a TAP instruction that causes the data to be latched for scanning into the example integrated circuit 104.

In one embodiment, the tester 102 includes a reference voltage generator 106, which provides a reference voltage 108 to each device under test. The reference voltage 108 may be an analog voltage(s) set between Vcc/Vss supply voltage levels around which device input circuitry is specified to trip (for either a logical "one" or a logical "zero").

In one embodiment, the example integrated circuit 104 is a processor, such as a processor of the Pentium® processor family available from Intel Corporation of Santa Clara, Calif. In other embodiments, the integrated circuit 104 may be other processors or integrated circuits.

Each integrated circuit 104 has die pads (110, 112, 114, 116, 118, 120), which are connected to corresponding pins (122, 124, 126, 128, 130, 132) on the example integrated circuit 104 package. There are six sets of pads and pins shown on the example integrated circuit 104, but it is well known that integrated circuits commonly have several hundred or more pads and corresponding pins.

Each example integrated circuit 104 also has a receiver (134, 136, 138). Each receiver may be a sense amplifier whose trip point determines whether the example integrated circuit 104 interprets an input direct current (DC) voltage level as a logical "one" or a logical "zero." There are three receivers shown on the example integrated circuit 104, but it is well known that integrated circuits commonly have several hundred or more receivers.

Each example integrated circuit 104 includes internal voltage generators (140, 142, 144), which correspond to the example receivers 134, 136, and 138, respectively. The outputs of the example internal voltage generators 140, 142, and 144 are coupled to the non-inverting inputs of the example receivers 134, 136, and 138, respectively, and the example reference voltage 108 is applied to the inverting inputs of the example receivers 134, 136, and 138. According to an embodiment, the example internal voltage generators 140, 142, and 144 provide input voltage levels (VIH and VIL) to the example receivers 134, 136, and 138, respectively, to test the example receivers' 134, 136, and 138 responses to sensing DC voltage levels associated with logical "ones" and logical "zeros" when the input voltage levels (VIH and VIL) swing up or down, respectively, beyond a minimum offset amount from the example reference voltage 108.

In one embodiment, each of the example internal voltage generators 140, 142, and 144 may be a digital-to-analog converter, which converts a digital input to an analog (or DC) output. In this embodiment, the digital input to the example internal voltage generators 140, 142, and 144 may be a set of configuration bits 150. The outputs of the example internal voltage generators 140, 142, and 144 are one or more DC voltage levels corresponding to the value of the configuration bits 150.

The tester 102 scans data in through one TAP port to the next TAP port of the next integrated circuit until all TAP ports are all filled. In one embodiment, the tester 102 scans in configuration bits 150, which program the internal voltage generators 140, 142, and 144 to output specific DC voltages (outputs 145, 147, 149, respectively).

Each value for the configuration bits 150 specifies a different voltage level to be output from the internal voltage generators 140, 142, and 144. For example, applying one value for the configuration bits 150 to the internal voltage generators 140, 142, and 144 causes the internal voltage generators 140, 142, and 144 to drive a voltage level the receivers 134, 136, and 138 should interpret as a logical "one." Applying another value for the configuration bits 150 to the internal voltage generators 140, 142, and 144 causes the internal voltage generators 140, 142, and 144 to drive a voltage level the receivers 134, 136, and 138 should interpret as a logical "zero." Of course, the configuration bits 150 may specify several different values that may be interpreted a logical "zeros" and/or a logical "ones."

The outputs 145, 147, and 149 are coupled to the non-inverting inputs of the receivers 134, 136, and 138, respectively, via switches (160, 162, 164). In one embodiment, the example switches 160, 162, and 164 may be any well known pass gates.

The integrated circuit 104 includes scan logic 170, which applies an enable signal value 172 to open and close the example switches 160, 162, and 164. The scan logic 170 also applies the configuration bits 150 to the example internal voltage generators 140, 142, and 144. The example scan logic 170 is accessible through the TAP scan chain of the devices under test and an embodiment of the example scan logic 170 is described in more detail with reference to FIG. 2.

Figure 2:
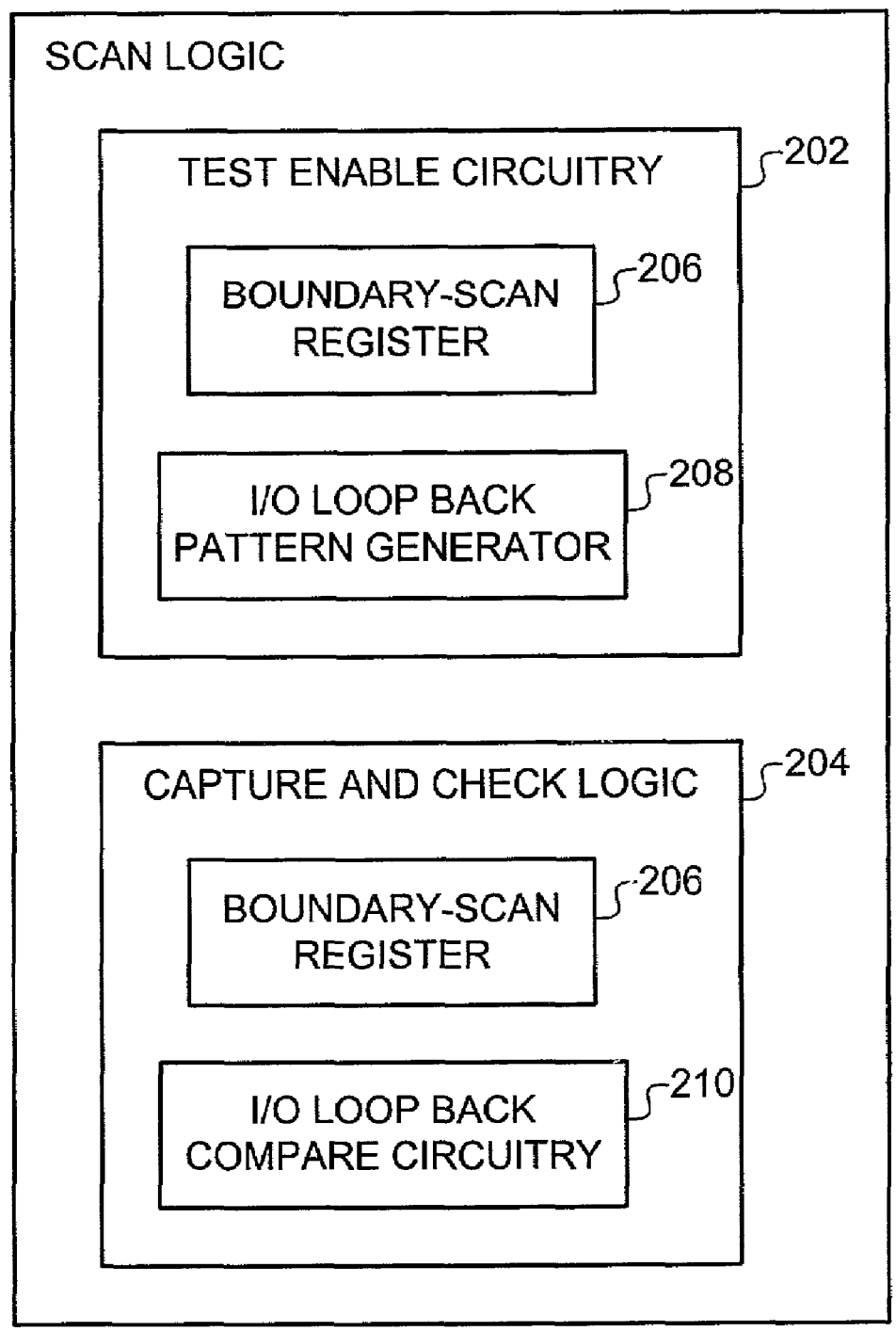
FIG. 2 is a high-level block diagram of portions of the scan logic in FIG. 1.

Each example integrated circuit 104 also includes capture and check logic (180, 182, 184), which correspond to the example receivers 134, 136, and 138, respectively. The example capture and check logic 180, 182, and 184 determines whether the example receivers 134, 136, and 138, respectively, captured the logical "ones" and logical "zeros" correctly. Although depicted as separate from the example scan logic 170, the example capture and check logic 180, 182, and 184 may be an integral part of the example scan logic 170. For example, FIG. 2 shows the example scan logic 170 with test enable circuitry 202 and capture and check logic 204.

In one embodiment, the example test enable circuitry 202 controls whether the example switches 160, 162, and 164 are open or closed via a JTAG boundary-scan register 206. Opening and closing the example switches 160, 162, and 164 disables or enables, respectively, input levels testing of the example receivers 134, 136, and 138. In an alternative embodiment, the example test enable circuitry 202 utilizes an I/O loop back pattern generator 208 to open and close the example switches 160, 162, and 164.

In one embodiment, after the example internal voltage generators 140, 142, and 144 drive one or more DC voltage levels to the example receivers 134, 136, and 138, the example capture and check logic 204 utilizes the example JTAG boundary-scan register 206 to capture and check the digital output from the example receivers 134, 136, and 138. In an alternative embodiment, after the example internal voltage generators 140, 142, and 144 drive one or more DC voltage levels to the example receivers 134, 136, and 138, the example capture and check logic 204 utilize I/O loop back compare logic 210 to capture and check the digital output from the example receivers 134, 136, and 138.

During testing, each internal voltage generator applies one or more DC voltage levels to its respective sense amplifier. Typically, the DC voltages are increased or decreased in an incremental fashion to determine the trip points of the sense amplifiers. Of course incrementing DC voltages by ten millivolts at a time provides more accuracy for purposes of trip point determination than incrementing DC voltages by one hundred millivolts at a time. Each sense amplifier compares the DC voltage level(s) to the reference voltage 108.

For example, when testing, each internal voltage generator applies one or more DC voltage levels to its respective sense amplifier and the tester 102 also applies the reference voltage 108. If a sense amplifier trips at the appropriate DC voltage level, the sense amplifier is determined to be working properly. If a sense amplifier fails to trip at the appropriate DC voltage level, the sense amplifier is determined to be defective. One common failure is a failure due to a defect that causes the sense amplifier trip point to shift towards the supply voltage $V_{CC}$, which implies that the sense amplifier may not properly detect a logical "one." Another common failure is a failure due to a defect that causes the sense amplifier trip point to shift towards ground (GND), which implies that the sense amplifier may not properly detect a logical "zero."

Figure 3:
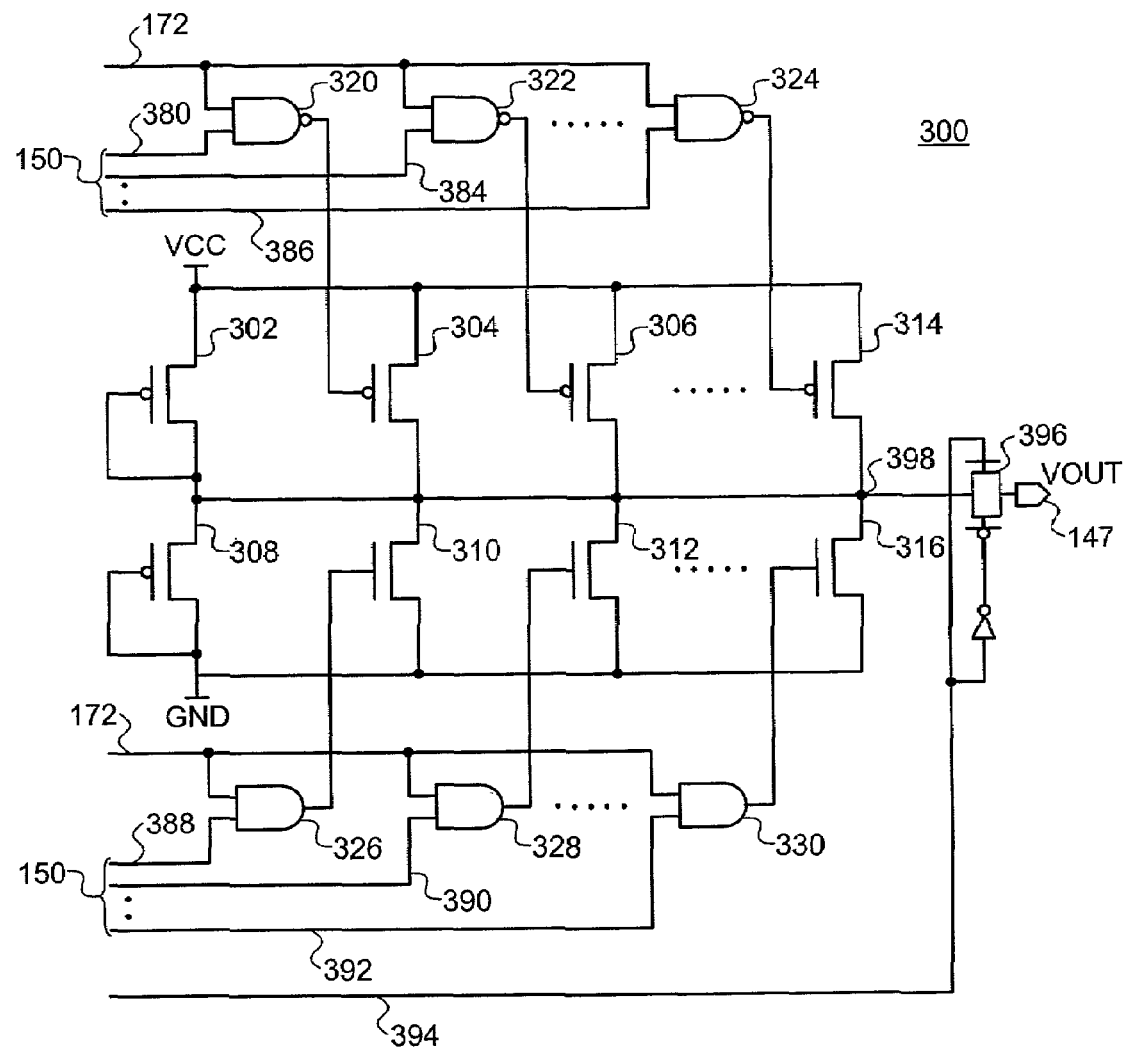
FIG. 3 is a schematic diagram of an example digital-to-analog converter suitable for implementing the internal voltage generator of FIG. 1.

FIG. 3 shows an embodiment of a digital-to-analog converter (DAC) 300 suitable for implementing on-die voltage generators such as the internal voltage generators 140, 142, and 144. The DAC 300 includes several biasing transistors (302, 304, 306, 308, 310, 312, 314, 316), several NAND gates (320, 322, 324), and several AND gates (326, 328, 330). The example transistors 302 and 308 are sized to present larger resistance values than the example transistors 304, 306, 310, 312, 314, and 316 (e.g., a voltage divider). The example transistors 304 and 310 are sized to present larger resistance values than the example transistors 306 and 312. The example transistors 306 and 312 are sized to present larger resistance values than the example transistors 314 and 316. A pass gate 396 couples the output from the DAC 300 (e.g., VOUT 147) to the sense amplifiers on the device under test. During normal operation of the device (e.g., not under testing conditions), the pass gate 396 is open. During levels testing, the pass gate 396 is closed to allow the voltage at the node 398 to be coupled out of the DAC 300 as VOUT 147.

When testing VIH (e.g., driving a logical "one"), the enable signal value 172 is applied to one input of each NAND 320, 322, and 324 gate and one bit each of the configuration bits 150 is applied to the other input of each NAND 320, 322, and 324 gate. For example, when the enable signal value 172 is active for testing VIH and none of the configuration bits 150 are "true" (e.g., all are a logical "zero"), the output from the DAC 300 (VOUT 147) is set by the transistors 302 and 308, which act as a voltage divider, to be substantially equivalent to the reference voltage 108. The output from the DAC 300 (VOUT 147) is modulated to different values via the values of the configuration bits 150 to achieve DC offsets to the reference voltage 108.

In one embodiment, when the enable signal value 172 is active for testing VIH and bit 380 of the configuration bits 150 is true (e.g., a logical "one"), the NAND gate 320 turns on the transistor 304, which shifts the voltage out of the DAC 300 up from the reference voltage 108 by a predetermined factor based on the relationship between the example transistor 302 an the example transistor 304. When the enable signal value 172 is active for testing VIH and bit 382 of the configuration bits 150 is true (e.g., a logical "one"), the NAND gate 322 turns on the transistor 306, which shifts the voltage out of the DAC 300 up from the reference voltage 108 by a predetermined factor based on the relationship between the example transistor 302 an the example transistor 306. When the enable signal value 172 is active for testing VIH and bit 386 of the configuration bits 150 is true (e.g., a logical "one"), the NAND gate 324 turns on the transistor 314, which shifts the voltage out of the DAC 300 up from the reference voltage 108 by a predetermined factor based on the relationship between the example transistor 302 an the example transistor 314.

At some point while incrementally increasing the voltage out of the DAC 300 up from the reference voltage 108, the sense amplifiers on the device under test trips, which reveals the DC voltage level the device under test interprets as a logical "one."

Similarly, when testing VIL (e.g., driving a logical "zero"), the enable signal value 172 is applied to one input of each AND gate 326, 328, and 330 and one bit each of the configuration bits 150 is applied to the other input of each AND gate 326, 328, and 330. For example, when the enable signal value 172 is active for testing VIL and none of the configuration bits 150 is "true" (e.g., all are a logical "zero"), the output from the DAC 300 is set by the transistors 302 and 308 to be substantially equivalent to the reference voltage 108.

In one embodiment, when the enable signal value 172 is active for testing VIL and bit 388 of the configuration bits 150 is true (e.g., a logical "one"), the AND gate 326 turns on the transistor 310, which shifts the voltage out of the DAC 300 down from the reference voltage 108 by a predetermined factor based on the relationship between the example transistor 308 an the example transistor 310. When the enable signal value 172 is active for testing VIL and bit 390 of the configuration bits 150 is true (e.g., a logical "one"), the AND gate 328 turns on the transistor 312, which shifts the voltage out of the DAC 300 down from the reference voltage 108 by a predetermined factor based on the relationship between the example transistor 308 an the example transistor 312. When the enable signal value 172 is active for testing VIL and bit 392 of the configuration bits 150 is true (e.g., a logical "one"), the AND gate 330 turns on the transistor 316, which shifts the voltage out of the DAC 300 down from the reference voltage 108 by a predetermined factor based on the relationship between the example transistor 308 an the example transistor 316.

At some point while incrementally decreasing the voltage out of the DAC 300 down from the reference voltage 108, the sense amplifiers on the device under test trips, which reveals the DC voltage level the device under test interprets as a logical "zero."

The relationships among the biasing transistors may be affected by variations in process, voltage ($V_{CC}$), and temperature. It will be readily apparent from reading the description herein how to compensate for variations in process, voltage ($V_{CC}$), and temperature.

Figure 4:
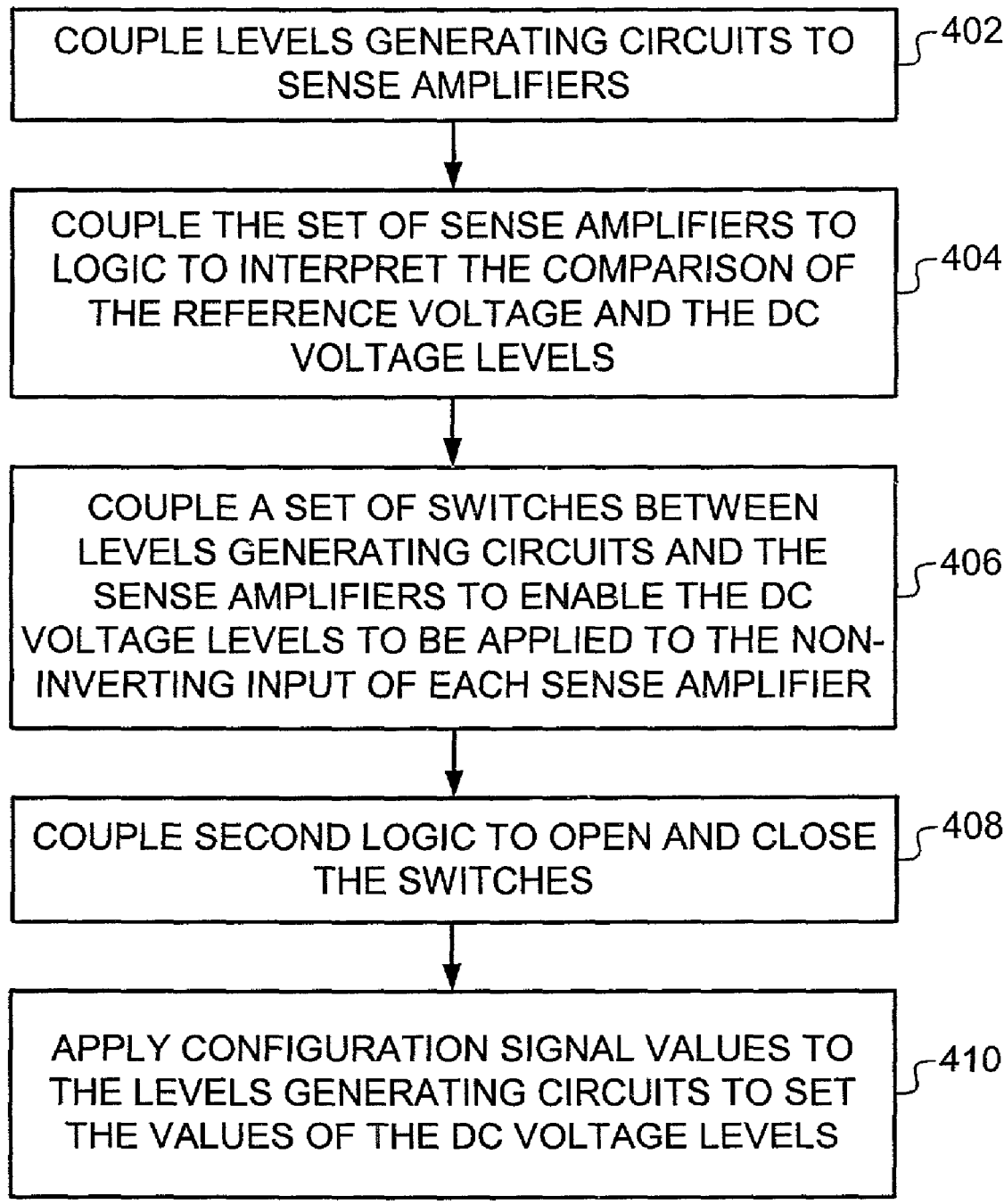
FIG. 4 is a flowchart illustrating an approach to manufacturing an integrated circuit according to embodiments of the present invention.

FIG. 4 is a flowchart of an example method 400 of manufacturing an integrated circuit according to embodiments of the present invention. A machine-readable medium with machine-readable instructions stored thereon may be used to cause a machine to perform the process 400.

Block 402 couples a set of levels generating circuits to a set of sense amplifiers. The set of sense amplifiers compare a reference voltage to a set of direct current (DC) voltage levels generated by the set of levels generating circuits. In one embodiment, block 402 couples a set of digital-to-analog converters to the set of sense amplifiers and the set of sense amplifiers compare the reference voltage to the set of direct current (DC) voltage levels generated by the set of levels generating circuits.

Block 404 couples the set of sense amplifiers to logic to interpret the comparison of the reference voltage and the set of DC voltage levels. In one embodiment, block 404 couples the set of sense amplifiers output signals to a boundary scan register to interpret the comparison of the reference voltage and the set of DC voltage levels In an alternative embodiment, block 404 couples the set of sense amplifiers output signals to input/output loop back compare circuitry to interpret the comparison of the reference voltage and the set of DC voltage levels.

Block 406 couples a set of switches between the set of levels generating circuits and the set of sense amplifiers to enable the set of DC voltage levels to be applied to the non-inverting input of each sense amplifier. Block 408 couples second logic to open and close the set of switches. In one embodiment, block 408 applies values from a boundary-scan register to open and close the set of switches. In an alternative embodiment, block 408 applies values from an input/output loop back pattern generator to open and close the set of switches.

Block 410 couples the set of levels generating circuits to be responsive to a set of configuration bits to set the values of the set of DC voltage levels. The set of DC voltage levels may be used to test sense amplifier trip points for VIL and/or VIH.

Additionally, a calibration procedure may be added to the test flow of the method 400 by monitoring voltage output of the internal voltage generators on a tester accessible pin on the integrated circuit.

Aspects of the invention can be implemented using hardware, software, or a combination of hardware and software. Such implementations include state machines and application specific integrated circuits (ASICs). In implementations using software, the software may be stored on a computer program product (such as an optical disk, a magnetic disk, a floppy disk, etc.) or a program storage device (such as an optical disk drive, a magnetic disk drive, a floppy disk drive, etc.).

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
an integrated circuit having circuitry to test input levels of the integrated circuit, the circuitry to test the input levels comprising:
a set of voltage generators to generate a set of direct current (DC) voltages;

a set of sense amplifiers coupled to compare an externally supplied reference voltage with the set of DC voltages, wherein the set of DC voltages is increased or decreased incrementally to determine a set of trip points of the sense amplifiers, respectively; and a boundary scan register coupled to each sense amplifier in the set of sense amplifiers to interpret the comparison of the externally supplied reference voltage and the set of DC voltages.

2. The integrated circuit of claim 1 wherein the set of voltage generators is responsive to a set of configuration bits to determine the set of DC voltages.

3. The integrated circuit of claim 2, further comprising a set of switches coupled between the set of voltage generators and the set of sense amplifiers to enable the set of DC voltages to be applied to the non-inverting input of each sense amplifier in the set of sense amplifiers.

4. The integrated circuit of claim 2, wherein each voltage generator in the set of voltage generators is a digital-to-analog converter.

5. The integrated circuit of claim 3, further comprising second logic to open and close a set of switches to connect the set of DC voltages to the non-inverting inputs of the set of sense amplifiers.

6. The integrated circuit of claim 5, wherein the second logic comprises a boundary-scan register.

7. The integrated circuit of claim 5, wherein the second logic comprises an input/output loop back pattern generator.

8. A system, comprising:
an integrated circuit having circuitry to test to input levels of the integrated circuit, the circuitry to test input levels of the integrated circuit comprising a set of voltage generators to generate a set of direct current (DC) voltages, a set of sense amplifiers coupled to compare a reference voltage with the set of DC voltages, and a boundary scan register coupled to each sense amplifier in the set of sense amplifiers to interpret the comparison of the reference voltage and the set of DC voltages, the set of voltage generators to incrementally increase and/or decrease the set of DC voltages to determine a set of trip points for the set of sense amplifiers, the set of trip points being associated with a logical one input voltage level and/or a logical zero input voltage level; and a structural tester coupled to the integrated circuit to apply a reference voltage to the inverting input of each sense amplifier in the set of sense amplifiers.

9. The system of claim 8, wherein the set of voltage generators is responsive to a set of configuration bits to determine the set of DC voltages.

10. The system of claim 8, wherein the integrated circuit further comprises a set of switches coupled between the set of voltage generators and the set of sense amplifiers to enable the set of DC voltages to be applied to the non-inverting input of each sense amplifier in the set of sense amplifiers.

11. The system of claim 8, wherein each voltage generator in the set of voltage generators is a digital-to-analog converter.

12. An apparatus, comprising:
an integrated circuit device having circuitry to test input levels of the integrated circuit, the circuitry to test the input levels comprising:
a set of input pins;
levels generating circuitry coupled to a subset of the input pins;
test enable circuitry to apply a set of configuration bits to the levels generating circuitry to enable concurrent input levels testing or parallel input levels testing of the set of input pins using the subset of input pins;
a set of voltage generators to generate a set of direct current (DC) voltages;
a set of sense amplifiers coupled to compare an external reference voltage with the set of DC voltages; and
boundary scan register coupled to each sense amplifier in the set of sense amplifiers to interpret the comparison of the external reference voltage and the set of DC voltages.

13. The apparatus of claim 12, further comprising a set of switches coupled between the set of voltage generators and the set of sense amplifiers to enable the set of DC voltages to be applied to the non-inverting input of each sense amplifier in the set of sense amplifiers.

14. The integrated circuit of claim 12, wherein each voltage generator in the set of voltage generators is a digital-to-analog converter.

15. A method, comprising:
testing input levels of at least one integrated circuit device having a first number of input pins and levels generating circuitry coupled to at least some of the first number of input pins by:
receiving a set of configuration bits at the levels generating circuitry;
receiving test input levels at a second smaller number of input pins to enable parallel input levels testing of the first number of input pins;
generating direct current (DC) voltages;
comparing an external reference voltage with the set of DC voltages; and
interpreting the comparison of the external reference voltage and the set of DC voltages.

16. The method of claim 15, wherein receiving a set of configuration bits at a levels generating circuitry comprises receiving a set of configuration bits at digital-to-analog converters.

17. A system, comprising:
an integrated circuit having circuitry to test input levels of the integrated circuit, the circuitry to test the input levels comprising a set of voltage generators to generate a set of direct current (DC) voltages, a set of sense amplifiers coupled to compare a reference voltage with the set of DC voltages, and input/output loop back compare circuitry coupled to each sense amplifier in the set of sense amplifiers to interpret the comparison of the reference voltage and the set of DC voltages, the set of voltage generators to incrementally increase and/or decrease the set of DC voltages to determine a set of trip points for the set of sense amplifiers, the set of trip points being associated with a logical one input voltage level and/or a logical zero input voltage level; and a structural tester coupled to the integrated circuit to apply a reference voltage to the inverting input of each sense amplifier in the set of sense amplifiers.

18. The system of claim 17, wherein the set of voltage generators is responsive to a set of configuration bits to determine the set of DC voltages.

19. The system of claim 17, wherein the integrated circuit further comprises a set of switches coupled between the set of voltage generators and the set of sense amplifiers to enable the set of DC voltages to be applied to the non-inverting input of each sense amplifier in the set of sense amplifiers.

20. The system of claim 17, wherein each voltage generator in the set of voltage generators is a digital-to-analog converter.

21. A system, comprising:
an integrated circuit having circuitry to test input levels of the integrated circuit, the circuitry to test the input levels comprising a set of voltage generators to generate a set of direct current (DC) voltages, a set of sense amplifiers coupled to compare a reference voltage with the set of DC voltages, and input/output back compare circuitry coupled to each sense amplifier in the set of sense amplifiers to interpret the comparison of the reference voltage and the set of DC voltages, the set of voltage generators to incrementally increase and/or decrease the set of DC voltages to determine a set of trip points for the set of sense amplifiers, the set of trip points being associated with a logical one input voltage level and/or a logical zero input voltage level;

a structural tester coupled to the integrated circuit to apply a reference voltage to the inverting input of each sense amplifier in the set of sense amplifiers; and a set of switches coupled between the set of voltage generators and the set of sense amplifiers to enable the set of DC voltages to be applied to the non-inverting input of each sense amplifier in the set of sense amplifiers, and wherein the integrated circuit further comprises second logic coupled to open and close the set of switches.

22. The system of claim 21, wherein the second logic comprises a boundary-scan register.

23. The system of claim 21, wherein the second logic comprises an input/output loop back pattern generator.

* * * * *